United States Patent [19]
Mellot

[11] Patent Number: 5,850,164
[45] Date of Patent: *Dec. 15, 1998

[54] FM DEMODULATION AND FREQUENCY TUNING FOR A PHASE-LOCKED LOOP

[75] Inventor: Pascal Mellot, Grenoble, France

[73] Assignee: SGS-Thomson Microelectronics S.A., Saint Genis, France

[ * ] Notice: The term of this patent shall not extend beyond the expiration date of Pat. No. 5,640,126.

[21] Appl. No.: 861,491

[22] Filed: May 22, 1997

Related U.S. Application Data

[63] Continuation of Ser. No. 585,242, Jan. 11, 1996, Pat. No. 5,640,126.

[30]     Foreign Application Priority Data

Jan. 13, 1995 [FR] France ................................ 95 00603

[51] Int. Cl.$^6$ .............................. H03D 3/06; H03L 7/099
[52] U.S. Cl. ..................... 331/177 R; 329/326; 331/11; 331/14; 331/17; 331/25; 331/34; 455/214; 455/260
[58] Field of Search .................................. 331/11, 14, 17, 331/25, 34, 57, 113 R, 177 R; 329/325, 326; 455/214, 260

[56]           References Cited

U.S. PATENT DOCUMENTS

| | | | |
|---|---|---|---|
| 3,909,735 | 9/1975 | Anderson et al. | 329/122 |
| 4,479,091 | 10/1984 | Yoshisato | 329/122 |
| 4,816,770 | 3/1989 | Naumann | 329/122 |
| 5,272,453 | 12/1993 | Traynor et al. | 331/57 |
| 5,335,364 | 8/1994 | Heinonen | 455/76 |
| 5,446,411 | 8/1995 | Horsfall et al. | 331/11 |

*Primary Examiner*—Siegfried H. Grimm
*Attorney, Agent, or Firm*—Wolf, Greenfield & Sacks, P.C.

[57]           ABSTRACT

The invention provides a demodulation PLL wherein: the first position of a switch, which is controlled by a control circuit, respectively connects the outputs of a mixer and a LP filter to high gain and low gain inputs of an oscillator when frequency signals at the inputs of the mixer have not converged sufficiently, i.e. during the PLLs tuning mode; the second position of the switch respectively connects the outputs of the mixer and the LP filter to the low gain and high gain inputs of the oscillator when the frequency signals at the inputs of the mixer and the signal levels on the input and output of the filter have converged sufficiently, i.e. during the PLLs demodulation mode.

34 Claims, 6 Drawing Sheets

FM DEMODULATION AND FREQUENCY TUNING FOR A PHASE-LOCKED LOOP

This application is a continuation of application Ser. No. 08/585,242, filed Jan. 11, 1996, entitled FM DEMODULATION AND FREQUENCY TUNING FOR A PHASE-LOCKED LOOP now U.S. Pat. No. 5,640,126.

BACKGROUND OF THE INVENTION

1. Field of the Invention

The present invention relates to the tuning of a phase-locked loop (PLL) and the demodulation of a modulated sound carrier and is particularly applicable to frequency modulated (FM) sound demodulation within a television receiver system. Such a system has a plurality of carrier frequencies that typically extend over the range of 4.5 MHz to 6.5 MHz.

2. Discussion of the Related Art

FIG. 1 represents a block diagram of a conventional FM demodulation PLL. This PLL includes a mixer 100, sometimes referred to as a multiplier, a low pass filter 110, a buffer 120, an amplifier 130 and a voltage controlled oscillator (VCO) 140.

The mixer 100 receives and mixes the signals $f_{IN}$ and $f_{VCO}$ that are respectively present on its inputs 150 and 160; input 160 being the output of the VCO 140. The output 170 of the mixer that carries the demodulated audio signal $f_D$ is passed through the filter 110 and then the buffer 120 and the output 180 of the buffer is connected to the inputs of the amplifier 130 and the VCO 140.

The FM input signal $f_{IN}$ is a composite signal that can correspond to any one of a plurality of carrier frequencies that are spread over a large frequency range. The problem associated with the system illustrated in FIG. 1 is that, because the carrier frequencies are spread over a large frequency range, the VCO 140 has to have a high gain, typically several MHz/Volt, so as to allow the PLL to lock onto any one of the plurality of carrier frequencies. Thus, carrier frequencies that are spread over a large dynamic range require a VCO that has a high gain and a frequency range that is greater than the carrier frequency range. However, the use of a high gain VCO results in a demodulated audio signal $f_D$ that has a small amplitude; typically in the range of tens of millivolts, which results in a demodulated audio signal $f_D$ that has a poor signal to noise ratio (SNR). The demodulated audio signal $f_D$ must then be amplified by the amplifier 130 to obtain a larger 'more workable' signal. However, the undesired noise will also be amplified by the same amount as the desired audio signal. Therefore, the respective SNRs at the input and the output of the amplifier 130 will be substantially the same. Furthermore, a high gain VCO will suffer from poor linearity characteristics that will ultimately affect the quality of the demodulated audio signal $f_D$.

Ideally, the required audio signal, that is superimposed on the carrier signal, should be demodulated by a VCO that has a low gain, so that the demodulated audio signal $f_D$ has an amplitude of some hundreds of millivolts; this would then ensure a good SNR.

Therefore with the system arrangement of FIG. 1, a conflict arises between the VCO gain requirements for its tuning and demodulation functional modes. It should be noted that the gain versus frequency response of the system of FIG. 1 is substantially static.

A object of the present invention is to provide a demodulation PLL that has an improved signal-to-noise ratio.

Another object of the invention is to provide a demodulation PLL that has improved demodulation linearity characteristics.

SUMMARY OF THE INVENTION

These and other objects are attained according to the present invention by a demodulation PLL that has a high gain loop for tuning and a low gain loop for demodulation. More specifically, the present invention provides for a demodulation phase-locked loop comprising a mixer connected to a controlled oscillator, in which the controlled oscillator has low and high gain control inputs and an output that is connected to an input of the mixer; a low pass filter has its input connected to the output of the mixer; a level comparator provides an active output signal when the signal levels on the input and output of the filter have converged sufficiently, a frequency comparator provides an active output signal when the signal frequencies on the inputs of the mixer have converged sufficiently; a controlled switch that has, a first position where the input and output of the filter are respectively connected to the high gain and low gain inputs of the controlled oscillator, and a second position where the input and output of the filter are respectively connected to the low gain and high gain inputs of the controlled oscillator; and control means for selecting the first position of the switch when the inputs of the mixer have not converged sufficiently and the second position of the switch when the inputs of the mixer and the signal levels on the input and output of the filter have converged sufficiently.

According to an embodiment of the demodulation PLL, the controlled oscillator comprises a current controlled oscillator and first and second voltage controlled current sources, that respectively have control inputs that correspond to the high gain and low gain inputs of the controlled oscillator, for controlling the frequency of the current controlled oscillator.

According to another embodiment of the demodulation PLL, the second voltage controlled current source has high linearity characteristics.

According to another embodiment of the demodulation phase-locked loop, it comprises a second low pass filter and a buffer that are connected downstream from the mixer and upstream from the first filter, the controlled switch, and the level comparator.

According to another embodiment of the demodulation PLL, the first filter is implemented by a suitable resistor and capacitor network filter.

According to another embodiment of the demodulation PLL, it comprises a means for reducing the resistance value of the resistor of the first filter when the switch is in its first position.

The present invention can be applied to a satellite receiver system and/or radio system and/or video system and/or television system including a cable television system.

BRIEF DESCRIPTION OF THE DRAWINGS

The objects, features and advantages, amongst others of the present invention will be described in more detail in the following description with reference to the attached drawings, that should be regarded as non-limiting, in which.

DETAILED DESCRIPTION

Figure 1:
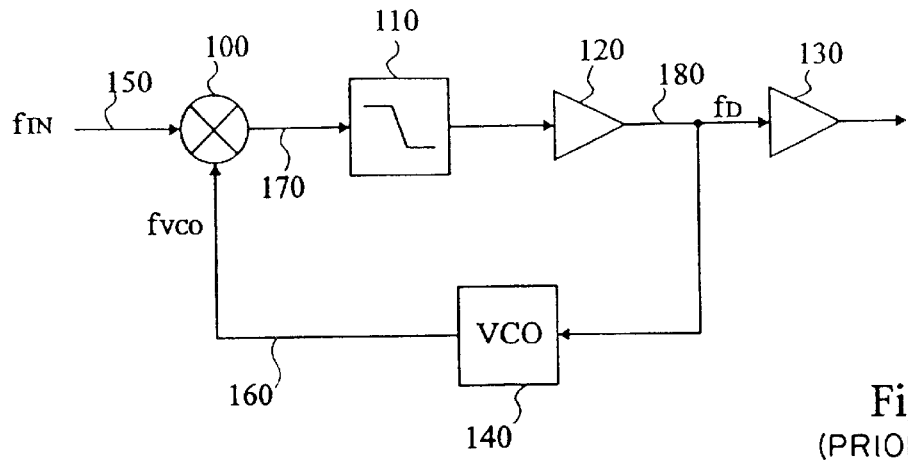
FIG. 1 represents a block diagram of a conventional FM demodulation PLL.
Figure 2:
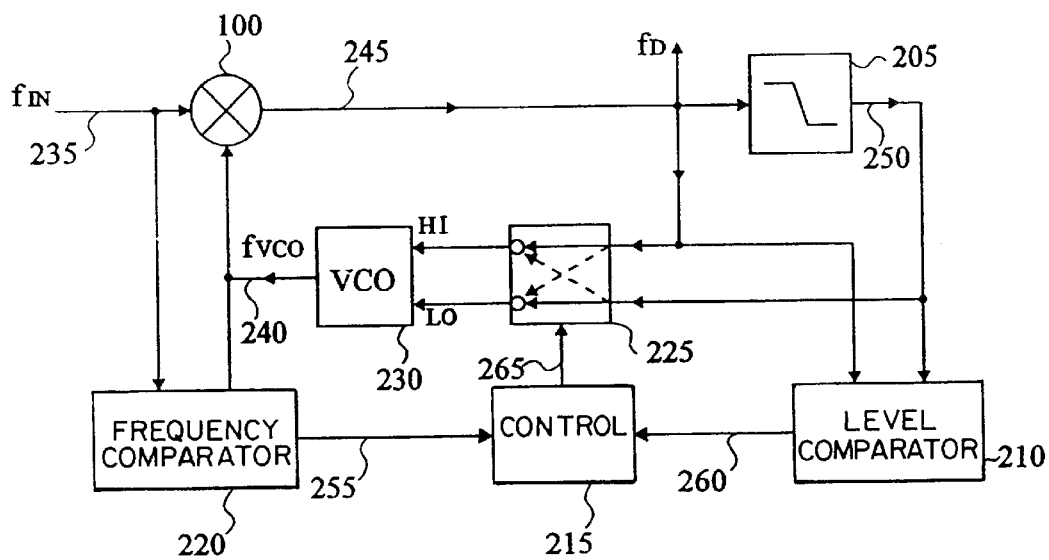
FIG. 2 illustrates a block diagram of an embodiment of an FM demodulation PLL according to the invention.

In FIG. 2 an FM demodulation PLL according to the present invention is illustrated as including: a mixer 100; a low pass filter 205; a level comparator 210; a control block 215; a frequency comparator 220; a dual input/output crossover switch 225; and a dual input voltage controlled oscillator 230. This FM demodulation PLL will also comprise a low pass filter and buffer (110, 120), as illustrated in FIG. 1, that have not been illustrated in this figure for reasons of clarity; the low pass filter (110) would filter out the high frequency 'sum' components of the mixer, whilst the buffer (120) would drive the impedance of the downstream low pass filter 205 without affecting the impedance of the upstream low pass filter (110).

The composite FM input signal $f_{IN}$ is supplied to common first inputs 235 of the mixer 100 and of the frequency comparator 220, whose common second inputs 240 are connected to the output of the VCO 230. The outputs 240, 245 of the VCO 230 and the mixer 100 are d.c. biased according to the required carrier frequency. The output 245 of the mixer 100 is connected to the input of the low pass filter 205, a first input of the switch 225 and a first input of the level comparator 210. The output 250 of the low pass filter 205 is connected to common second inputs of the switch 225 and the level comparator 210. The respective outputs 255, 260 of the frequency and level comparators 220, 210 are connected to the control block 215 whose output 265 controls the switch 225 in response to its inputs (255, 260). The first and second outputs HI, LO of the switch 225 are respectively connected to the first and second inputs of the VCO 230 that respectively correspond to a high gain input HI and a low gain input LO.

The diagram of FIG. 2 has two modes of functioning; in the first mode, the PLL tunes and locks onto the required carrier frequency, whilst in the second mode, the PLL demodulates the audio signal of the locked carrier frequency.

In order to make the following analysis more comprehensible the following values have been assumed:

input frequency ($f_{IN}$) range 4.5–6.5 MHz;

VCO high gain input (HI) 3 MHz/V—d.c. bias 5V@ 6 MHz;

VCO low gain input (LO) 70 KHz/V;

low pass filter (205) cut-off frequency 0.7 Hz.

These values are exemplary and it should be understood that they are not intended to be limiting with respect to the present invention.

Analysing the first mode, the switch 255 is in its first position (shown in full lines) where its first and second inputs 245, 250 are respectively connected to the high and low gain inputs of the VCO 230. The low frequency gain of this system during this tuning mode is determined by the sum of the gains of the high and low gain inputs HI, LO of the VCO. This 'sum of the gains' is due to the fact that the low pass filter 205 has a minimal effect upon its input signal when this input signal has a frequency $f_s$ that is less than that of the cut-off frequency (in this example 0.7 Hz) of the low pass filter 205. Therefore when $0 \leq f_s \leq 0.7$ Hz, the overall low frequency gain of this system is 3.07 MHz/V (3.0+0.07 MHz/V). However, the high frequency gain of this system during this tuning mode is determined by the high gain input HI of the VCO. This 'HI input' gain is due to the fact that the low pass filter 205 substantially attenuates its input signal when this input signal has a frequency $f_S$ that is greater than that of the cut-off frequency (0.7 Hz) of the low pass filter 205. Therefore when $f_s > 0.7$ Hz, the overall high frequency gain of this system is 3.0 MHz/V. Thus, during this first mode it is substantially the d.c. component of the output 245 of the mixer 100 (and of course the output 240 of the VCO 230) that has a high gain so as to ensure rapid and correct locking of the carrier, with any demodulated audio signal having very little influence on the system gain.

The PLL will tend to lock onto the required carrier frequency in much the same manner as the PLL of FIG. 1. However, the arrangement of FIG. 2 includes a switch control block 215 that is responsive to the respective outputs 255, 260 of the frequency and level comparators 220, 210 so that when the frequencies of the signals on the inputs 235, 240 of the mixer 100 are substantially equal, the frequency comparator outputs an active signal, for example a logic 1 signal, and when the levels of the signals on the inputs 245, 250 of the switch 225 are substantially equal, the level comparator outputs an active signal. The control block 215 responds to the active signals of both the comparators such that it changes the switch 225 from its first position to its second position (shown in dotted lines). The control block 215 will preferably only change the switch 225 back to its first position when the output signal of the frequency comparator 220 changes, for example, from a logic 1 state to a logic 0 state, no matter what the state of the output signal of the level comparator 210, i.e. the control block acts as a latch. When the switch changes from its first position to its second position, the PLL changes from its first functional mode to its second functional mode.

Analysing the second mode, the switch 255 is in its second position where its first and second inputs 245, 250 are respectively connected to the low and high gain inputs LO, HI of the VCO 230. As with the first mode, the low frequency gain of this system during this second, demodulation, mode is determined by the sum of the gains of the high and low gain inputs HI, LO of the VCO. Therefore when $0 \leq f_S \leq 0.7$ Hz, the overall low frequency gain of this system is 3.07 MHz/V. However, the high frequency gain of this system during this demodulation mode is determined by the low gain input LO of the VCO. This 'LO input' gain is due to the fact that the low pass filter 205 substantially attenuates its input signal when this input signal has a frequency $f_S$ that is greater than that of the cut-off frequency (0.7 Hz) of the low pass filter 205. Therefore when $f_S > 0.7$ Hz, the overall high frequency gain of this system is 0.07 MHz/V or 70 KHz/V. Thus, during this second mode it is substantially the audio a.c. component of the output 245 of the mixer 100 (and of course the output 240 of the VCO 230) that has a low gain so as to ensure a large demodulated audio signal $f_D$ that has a good SNR, with the d.c. signal having very little influence on the system gain; yet this d.c. signal is always present thus ensuring the system is locked to the required carrier.

Therefore, the gain versus frequency response of the VCO will roll-off from 3.07 MHz/V at 0.7 Hz to 70 KHz/V at 30 Hz; 30 Hz corresponding to the frequency at which the VCO gain equals 70 KHz/V plus 3 dB. In this case, the audio signal is demodulated with a VCO that has a low gain, which results in a demodulated audio signal $f_D$ of some hundreds of millivolts. Therefore, the SNR of this demodulated audio signal $f_D$ will be better than the demodulated audio signal $f_D$ that is associated with FIG. 1.

Figure 3:
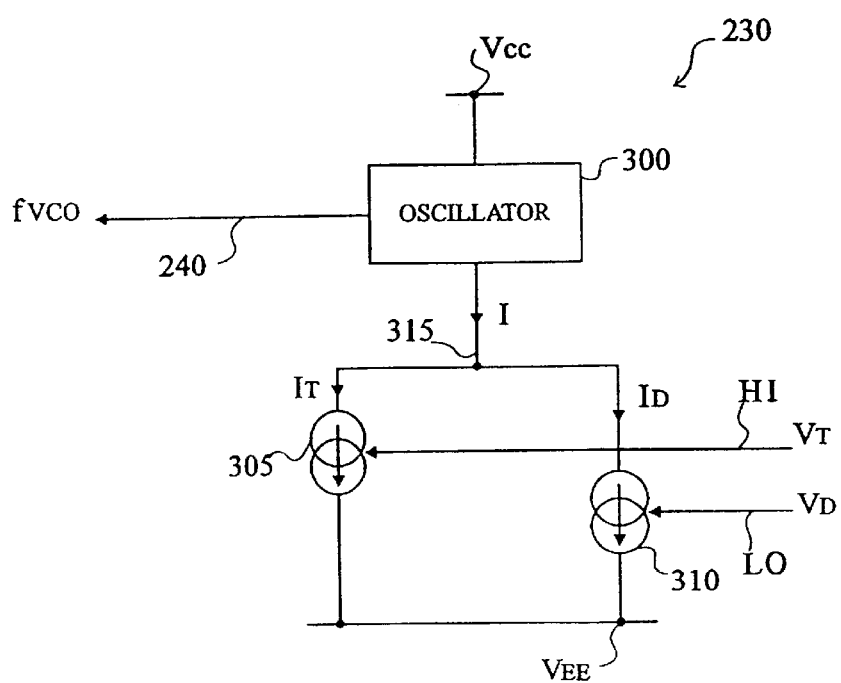
FIG. 3 illustrates a block diagram of an embodiment of the VCO of FIG. 2.

FIG. 3 illustrates a block diagram of an embodiment of the VCO of FIG. 2. The VCO 230 includes an oscillator 300 and two controlled current sources 305, 310. The oscillator 300 is preferably a conventional current controlled oscillator such as an emitter coupled oscillator. It is supplied by a positive voltage source VCC and provides a frequency signal $f_{VCO}$ on the output 240 and a current I on an output 315. The frequency of the signal $f_{VCO}$ is proportional to the current I.

The high sides of the current sources 305, 310 are connected to the output 315 and their low sides are connected to another voltage source VEE that is less positive than the voltage source VCC. Current source 305 corresponds to a high gain current source, that is controlled by a 'tuning voltage' $V_T$ on the input HI, and passes a current $I_T$, whereas current source 310 corresponds to a low gain current source, that is controlled during demodulation by a 'demodulation voltage' $V_D$ on the input LO, and passes a current $I_D$. The current I is the sum of the currents $I_T$ and $I_D$. Current sources 305 and 310 are controlled by the voltages $V_T$, $V_D$ on their respective inputs HI, LO such that the current I is modulated about a centre value, which in turn modulates the output frequency signal $f_{VCO}$ about a centre frequency $F_O$.

Figure 4A:
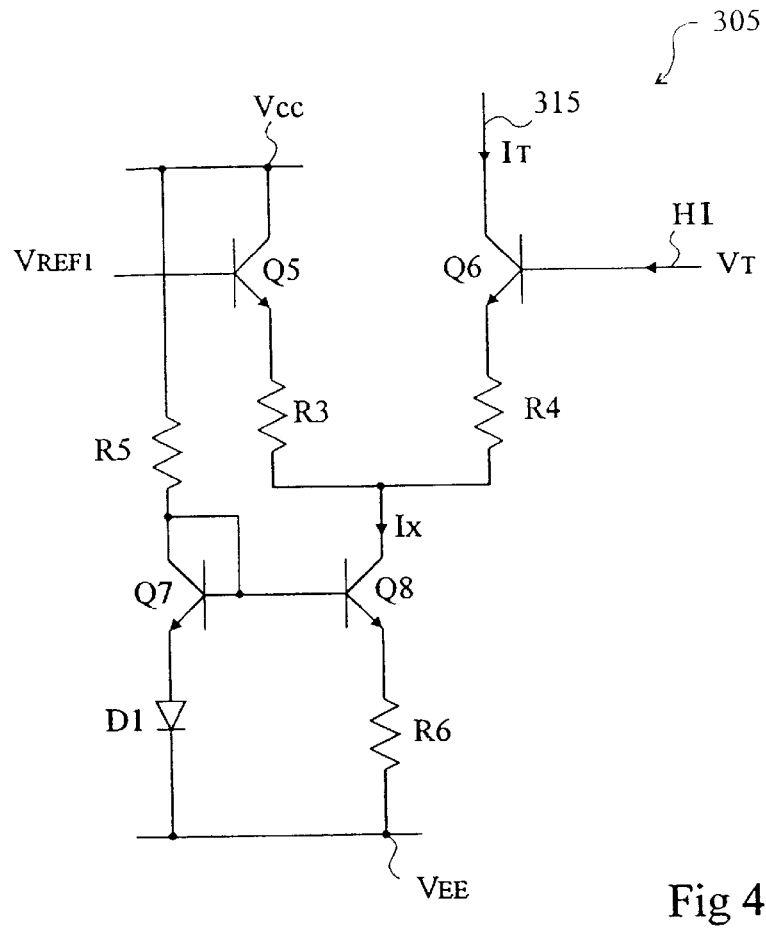
FIG. 4A illustrates a circuit diagram of a high gain current source of FIG. 3.
Figure 4B:
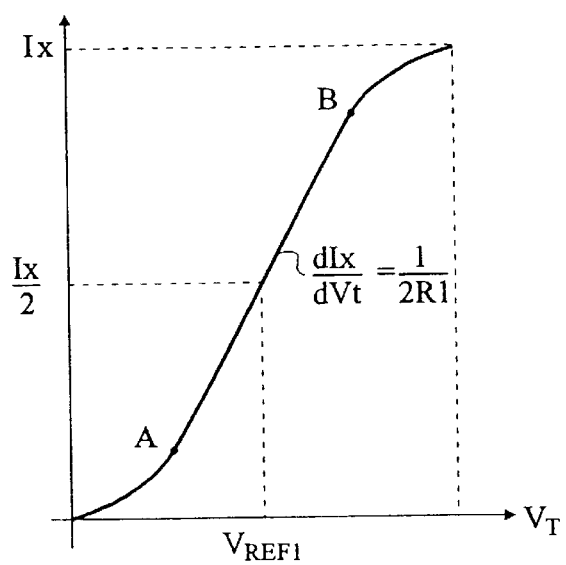
FIG. 4B illustrates the transfer characteristic of the circuit of FIG. 4A.

FIG. 4A illustrates a circuit diagram of an embodiment of the high gain current source 305 of FIG. 3 and FIG. 4B illustrates the transfer characteristic of the high gain current source of FIG. 4A. This high gain current source 305 includes four NPN transistors Q5–Q8 and four resistors R3–R6. The gain of this current source is approximately proportional to the resistor ratio R3/R6; resistors R3 and R4 have the same value. The collector of transistor Q5 is connected to voltage VCC, its emitter is connected to the collector of transistor Q8 via resistor R3 and its base is biased by a reference voltage $V_{REF1}$. The collector of transistor Q6 corresponds to the output 315, its emitter is connected to the collector of transistor Q8 via resistor R4 and its base corresponds to the input HI. The emitter of transistor Q8 is connected to voltage VEE via resistor R6.

The collector of transistor Q7 is connected to voltage VCC via resistor R5. The base terminals of transistors Q7 and Q8 are connected to the collector of transistor Q7. The emitter of transistor Q7 is preferably connected to the voltage VEE via a diode D1 which provides temperature compensation in association with an emitter coupled oscillator; diode D1 can be realised, for example, by a diode connected npn-type transistor.

This current source 305 is in fact a differential amplifier with a current mirror in its tail. The tail current $I_X$ is given by the relationship $I_X = V_{BE}(\text{diode})/R6$. Therefore, the current $I_T$ is approximated by the relationship:

$$I_T = (I_X/2) + (V_T - V_{REF1})/2.R3 = (V_{BE}(\text{diode})/2.R6) + (V_T - V_{REF1})/2;$$

which reduces to $I_T = V_{BE}(\text{diode})/2.R6$ when $V_T = V_{REF1}$.

The centre frequency $F_O$ of the PLL is proportional to:

$$I_T = [(V_{BE}(\text{diode})/2.R6) + (V_T - V_{REF1})/2.R3].$$

The gain of the voltage controlled current source 305 is given by the relationship $dI_T/dV_T = 1/2.R3$ and the gain of the VCO with respect to the high gain input HI is proportional to $I_T$.

Referring to FIG. 4B, it can be seen that the transfer characteristic is linear, in practise, only about point $V_{REF}$, $I_X/2$, i.e. between points A and B.

Figure 5A:
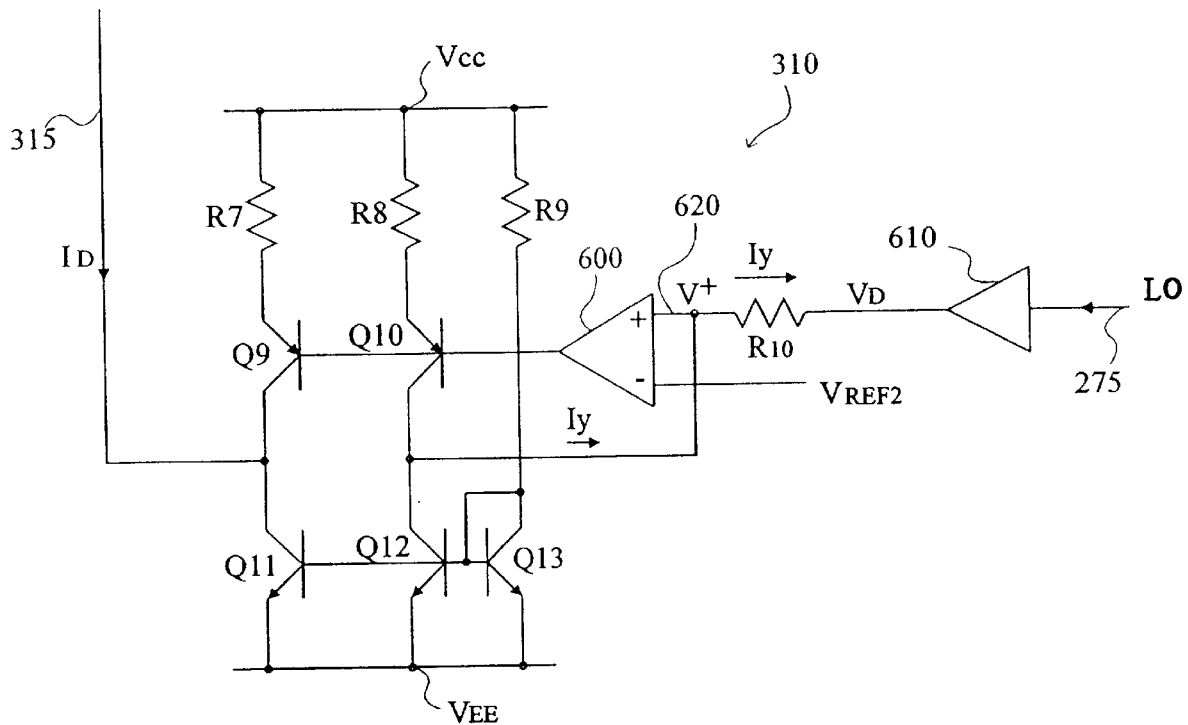
FIG. 5A illustrates a circuit diagram of a low gain current source of FIG. 3.
Figure 5B:
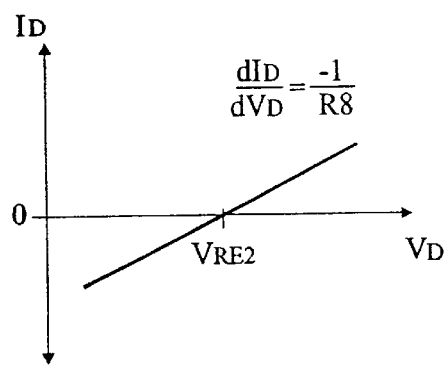
FIG. 5B illustrates the transfer characteristic of the circuit of FIG. 5A.

FIG. 5A illustrates a circuit diagram of an embodiment of the low gain current source 310 of FIG. 3 and FIG. 5B illustrates the transfer characteristic of the current source. This low gain current source 310 includes: two PNP transistors Q9, Q10; three NPN transistors Q11–Q13; four resistors R7–R10; an operational amplifier 600 and a buffer 610.

The emitters of transistors Q9 and Q10 are connected to voltage VCC via the respective resistors R7 and R8. The collectors of transistors Q9 and Q10 are respectively connected to the collectors of transistors Q11 and Q12 whose emitters are connected to voltage VEE. The collectors of transistors Q9 and Q11 are connected to the output 315 and receive the current $I_D$ (FIG. 3). The base terminals of transistors Q11 and Q12 are connected to the base and collector of transistor Q13. The collector of transistor Q13 is connected to voltage VCC via resistor R9. Transistor Q13 acts as the input transistor of a current mirror having transistors Q11 and Q12 as output transistors. The output LO of the switch 225 is connected to the input of the buffer 610 which is preferably a unity gain buffer. The output of the buffer 610, that is at voltage $V_D$, is connected to the positive input 620 of the amplifier 600 via resistor R10. The input 620 is a voltage designated by V+. The collectors of transistors Q10 and Q12 are connected to the amplifier input 620. The negative input of the amplifier 600 is connected to a reference voltage source $V_{REF2}$. The base terminals of transistors Q9 and Q10 are connected to the output 620 of the amplifier 600.

The amplifier 600 operates such that its positive and negative inputs are always maintained the same, i.e. $V+ = V_{REF2}$. This causes a current $I_Y$ to flow from the collector of transistor Q10 through the resistor R10, this current value being given by the relationship $I_Y = [(V+)-V_D]/R10 = (V_{REF2}-V_D)/R10$. Therefore, the current $I_D$ is obtained as a result of mirroring it to the current $I_Y$ such that $I_D = -I_Y = -(V_{REF2}-V_D)/R10$. The modulation frequency $F_M$ is proportional to $I_D$ and thus to $-(V_{REF2}-V_D)R10$.

If the amplifier 600 has a high gain, this enables the current versus voltage response to be extremely linear as illustrated in FIG. 5B.

Figure 6:
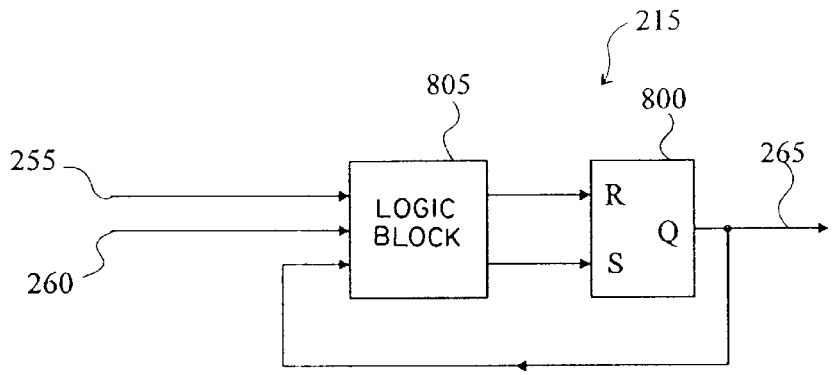
FIG. 6 illustrates a block diagram of an embodiment of a control block of FIG. 2.

FIG. 6 illustrates a block diagram of an embodiment of the control block 215 of FIG. 2. This control block 215 includes an Set-Reset (S-R) type flip-flop 800 and a logic block 805. The respective outputs 255, 260, 265 of the frequency comparator 220, the level comparator 210 and the flip-flop 800 are received by the logic block 805.

The flip-flop 800 and the logic block 805 are arranged, for example, such that the output 265 of the flip-flop 800 has a logic 0 state until the inputs 255, 260 both have logic 1 states, i.e. until the frequencies of the signals on the inputs 235, 240 of the mixer 200 are substantially equal and the levels of the signals on the inputs 245, 250 of the switch 225 are substantially equal. When the inputs 255, 260 both have logic 1 states, the output 265 of the flip-flop 800 changes from a logic 0 state to a logic 1 state and remains at a logic 1 state until the output 255 of the frequency comparator 220 changes state to indicate that the frequency of the PLL is not 'locked', no matter what the state of the signal from the level comparator 210, i.e. the flip-flop 800 and the logic block 805 act as a latch.

Figure 7A:
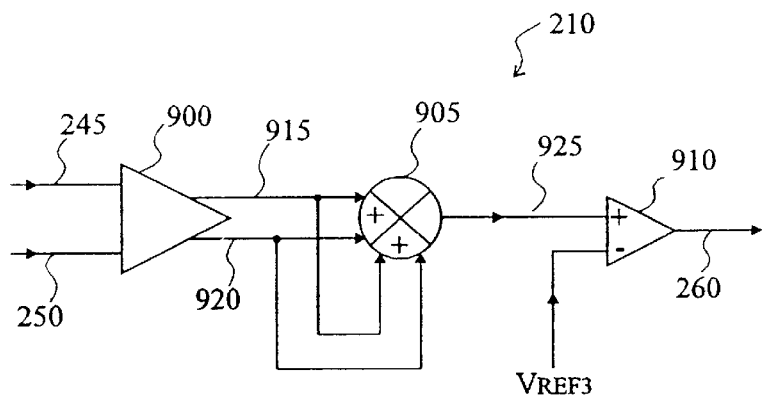
FIG. 7A illustrates a block diagram of an embodiment of a level comparator of FIG. 2.

FIG. 7A illustrates a block diagram of an embodiment of the level comparator 210 of FIG. 2. This diagram illustrates an amplifier 900, a mixer 905 and a comparator 910.

The amplifier 900, which provides differential outputs 915, 920, receives inputs from the input 245 and output 250 of the filter 205. The outputs 915, 920 are connected to the mixer 905 which performs a squaring function, i.e. an $X^2$ function, upon the inverted and non-inverted voltage difference $\Delta V$ of the signals on these outputs 915, 920. The output 925 of the mixer is connected to the positive input of the comparator 910, whose negative input is biased by a reference voltage $V_{REF3}$, and whose output 260 provides a logic signal.

Figure 7B:
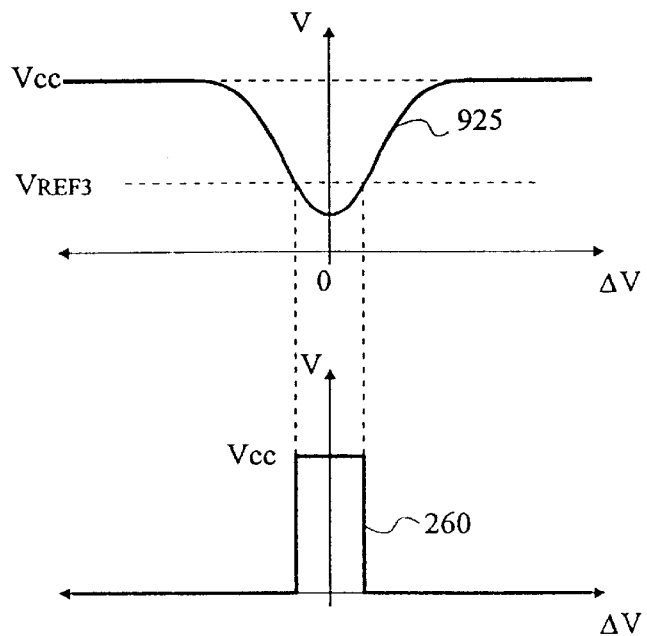
FIG. 7B illustrates the relationship of the signals of FIG. 7A.

FIG. 7B illustrates the relationship of the signals that are present on the outputs 925 and 260 of FIG. 7A. The uppermost signal represents the product of the inverted and non-inverted voltage difference $\Delta V$ of the signals present on the outputs 915 and 920 of the amplifier 900. The lower signal represents the signal on the output 260 of the comparator 910. When the voltage on the output 925 of the mixer 905 is less than $V_{REF3}$, the comparator output 260 has a logic 1 state and when the voltage on the output 925 of the mixer 905 is greater than $V_{REF3}$, the comparator output 260 has a logic 0 state.

Figure 8A:
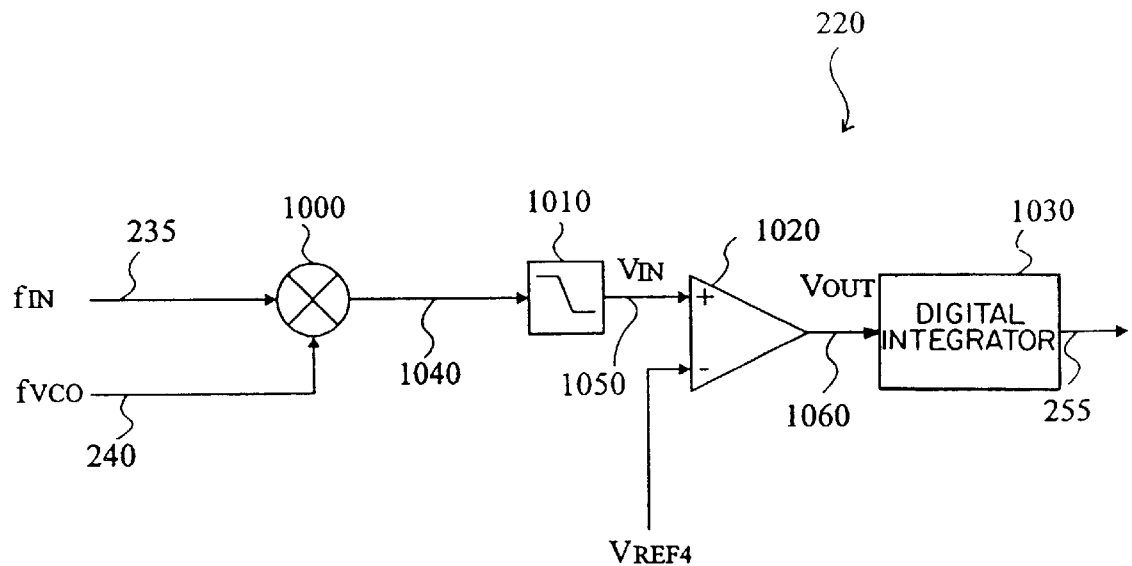
FIG. 8A illustrates a block diagram of an embodiment of a frequency comparator of FIG. 2.

FIG. 8A illustrates a block diagram of an embodiment of the frequency comparator 220 of FIG. 2. This diagram illustrates a mixer 1000, a low pass filter 1010, a comparator 1020 and a digital integrator 1030.

The mixer 1000 mixes the respective signals $f_{IN}$, $f_{VCO}$ on the inputs 235, 240 and produces an output 1040 that is connected to the filter 1010. Filter 1010 has a cut-off frequency of 400 KHz, for example. The output 1050 of the filter 1010, which is a voltage $V_{IN}$, is connected to the positive input of the comparator 1020, whose negative input is biased by a reference voltage $V_{REF4}$. Comparator 1020 provides a logic signal $V_{OUT}$ on its output 1060 that is connected to the input of the integrator 1030. The output of integrator 1030 constitutes the output 255.

Figure 8B:
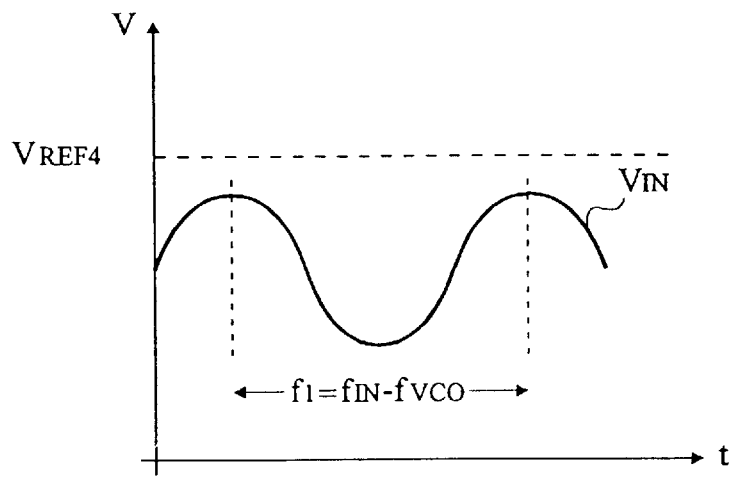
FIG. 8B illustrates the output voltage of the filter of FIG. 8A as a function of the frequency difference between the input frequency and VCO frequency when the frequency difference is greater than approximately 1 MHz.

FIG. 8B illustrates the voltage $V_{IN}$, i.e. the output voltage of filter 1010, when the frequency difference $f_1$ between $f_{IN}$ and $f_{VCO}$ is greater than approximately 1 MHz. The filter 1010 filters out the frequency components greater than approximately 400 KHz and this leaves a signal whose peak value is never greater than the reference $V_{REF4}$. Therefore, the output of the comparator 1020 and the integrator is always at a logic 0 state.

Figure 8C:
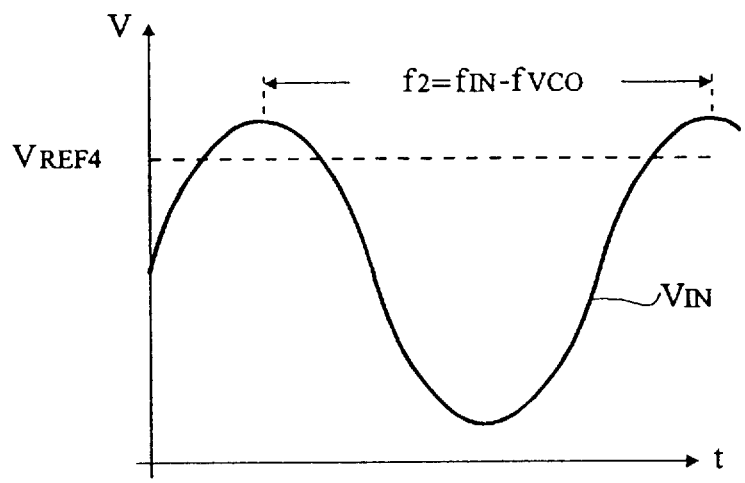
FIG. 8C illustrates the output voltage of the filter of FIG. 8A as a function of the frequency difference between the input frequency and VCO frequency when the frequency difference is less than approximately 1 MHz.

FIG. 8C illustrates the voltage $V_{IN}$ when the frequency difference $f_2$ between $f_{IN}$ and $f_{VCO}$ is less than approximately 1 MHz. Again, the filter 1010 filters out the frequency components greater than approximately 400 KHz. However, in this case $V_{IN}$ has a peak value that is sometimes greater than the reference $V_{REF4}$ since the filter 1010 has less influence on its input signal, which results in an output signal ($V_{IN}$) with a greater amplitude. Therefore, the output of the comparator 1020 will have a logic 1 state each time $V_{IN}$ is greater than $V_{REF4}$. The integrator acts as a filter with respect to the output of the comparator and can be arranged such that it will have a logic 0 state until the frequencies $f_{IN}$, $f_{VCO}$ have converged sufficiently, for example the frequencies $f_{IN}$, $f_{VCO}$ are within 100 KHz of each other.

Figure 8D:
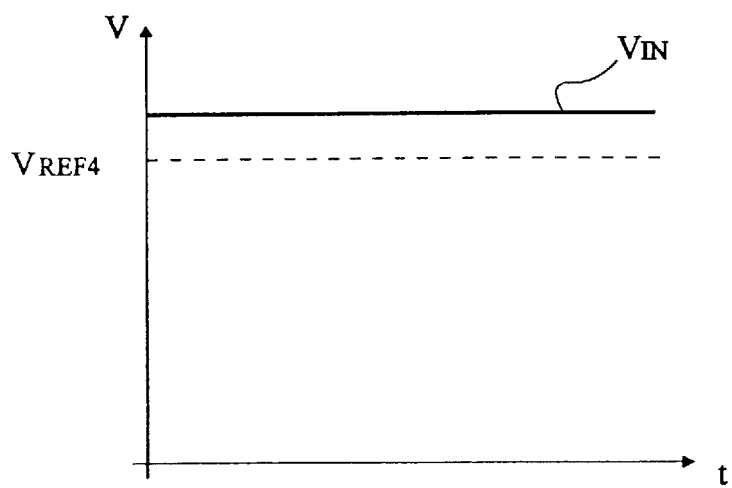
FIG. 8D illustrates the output voltage of the filter of FIG. 8A as a function of the frequency difference between the input frequency and VCO frequency when the frequency difference is approximately zero.

FIG. 8D illustrates the voltage $V_{IN}$ when the frequency difference $f_2$ between $f_{IN}$ and $f_{VCO}$ is approximately zero. In this case, the voltage $V_{IN}$ is substantially a d.c. voltage which is always greater than $V_{REF4}$, and as a result, the respective outputs 1060 and 255 of the comparator and integrator have logic 1 states.

Figure 9A:
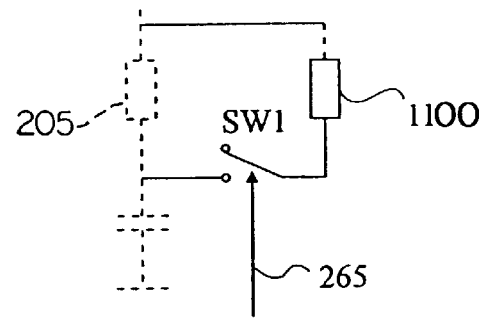
FIG. 9A illustrates an embodiment of an accelerator for reducing the time constant of the low pass filter of FIG. 2.
Figure 9B:
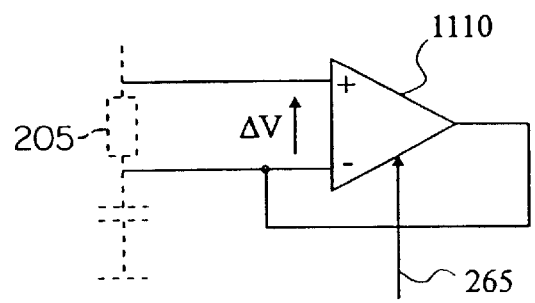
FIG. 9B illustrates a variant circuit of FIG. 9A.

FIGS. 9A and 9B illustrate two embodiments of an accelerator, that can be used in conjunction with the present invention, for reducing the time constant of the low pass filter 205 of FIG. 2, when the filter 205 is an RC low pass filter as shown in dotted lines.

The basic function of the accelerator is that, during the 'tuning' mode, i.e. during the first functional mode, it reduces the resistance of the low pass filter so that the capacitor within the filter 205 can charge more rapidly, i.e. the capacitor can track the input voltage of the filter more rapidly. In FIG. 9A, the accelerator is a switched resistance 1100 placed in parallel with the filter resistance. The switched resistance being controlled by the output 265 of the control block such that when the system is in its first functional mode the switched resistance is placed in parallel with the filter resistance and when the system is in its second functional mode, i.e. 'demodulation' mode, the switched resistance has no effect upon the filter resistance.

Alternatively, as illustrated in FIG. 9B, the switched resistance can be realised with a suitably connected and controlled transconductance amplifier 1110.

The present invention can be adapted so that it is advantageously used in the demodulation, preferably but not necessarily FM demodulation, of sound within radio systems and/or television systems and/or video systems and/or satellite receiver systems.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A controlled oscillator for providing an output signal, comprising:

a current controlled oscillator;

a first input, for receiving a high gain control signal;

a second input, for receiving a low gain control signal; and first and second voltage controlled current sources, coupled to said current controlled oscillator, each having a control input, with the control input of said first voltage controlled current source being coupled to said high gain control input and the control input of said second voltage controlled current source being coupled to said low gain control input.

2. The controlled oscillator according to claim 1, wherein said current controlled oscillator provides said output signal responsive to a current on a signal line coupling said current controlled oscillator to said voltage controlled current sources.

3. The controlled oscillator according to claim 1, wherein each of said first and second voltage controlled current sources comprise a first and second end, each coupled at said first end to a first voltage source, and at said second end to a second voltage source, where a voltage provided by of said second voltage source is relatively smaller than a voltage provided by said first voltage source.

4. The controlled oscillator according to claim 1, wherein said current controlled oscillator is an emitter coupled oscillator.

5. The controlled oscillator according to claim 1, wherein said first voltage controlled current source comprises a differential amplifier coupled to a current mirror.

6. The controlled oscillator according to claim 1, wherein said second voltage controlled current source comprises an operational amplifier coupled to a current mirror.

7. A demodulation phase-locked loop, comprising:
   a mixer having a first input for receiving an input signal;
   a controlled oscillator connected to the mixer, said controlled oscillator having a low gain control input, a high gain control input and an output connected to a second input of said mixer;
   a controlled switch, having a first position for coupling said low gain control input of said controlled oscillator to a first signal line, and for coupling said high gain control input of said controlled oscillator to a second signal line, and having a second position for coupling said high gain control input to said first signal line, and said low gain control input to said second line, wherein said position of said switch is selected according to an operating mode of said phase-locked loop.

8. The demodulation phase-locked loop according to claim 7, wherein said switch is in said first position when said phase-locked loop operates in a tuning mode, and wherein said switch is in said second position when said phase-locked loop operates in demodulation mode.

9. The demodulation phase-locked loop according to claim 7, wherein said controlled oscillator provides a high gain output when said switch is in said first position, and wherein said controlled oscillator provides a low gain output when said switch is in said second position.

10. The demodulation phase-locked loop according to claim 7, further comprising:
    a control unit, coupled to said controlled switch, to select said position of said controlled switch; and
    a frequency comparator, coupled to said output of said controlled oscillator and to said input signal, to determine a convergence of a frequency of a signal at said output of said controlled oscillator with a frequency of said input signal, said frequency comparator having an output coupled to said control unit to indicate said convergence of frequencies to said control unit.

11. The demodulation phase-locked loop according to claim 10, further comprising:
    a level comparator, coupled to an input and an output of a first filter coupled to said mixer, to monitor a convergence of voltage levels of signals at said input and output of said first filter, said level comparator having an output coupled to said control unit to indicate said convergence of voltage levels to said control unit.

12. The demodulation phase-locked loop according to claim 7, wherein said second signal line provides a filtered version of a signal on said first signal line.

13. The demodulation phase-locked loop according to claim 7, wherein said controlled oscillator further comprises:
    a current controlled oscillator; and
    first and second voltage controlled current sources, coupled to said current controlled oscillator, each having a control input, with the control input of said first voltage controlled current source being coupled to said high gain control input and the control input of said second voltage controlled current source being coupled to said low gain control input.

14. The demodulation phase locked loop according to claim 13, wherein said current controlled oscillator provides said output of said controlled oscillator responsive to a current on a signal line coupling said current controlled oscillator and said voltage controlled current sources.

15. The demodulation phase locked loop according to claim 13, wherein each of said first and second voltage controlled current sources comprises a first and second end, each coupled at said first end to a first voltage source, and at said second end to a second voltage source, where a voltage provided by of said second voltage source is relatively smaller than a voltage provided by said first voltage source.

16. The demodulation phase locked loop according to claim 13, wherein said current controlled oscillator is an emitter coupled oscillator.

17. The demodulation phase locked loop according to claim 15, wherein said first voltage controlled current source comprises a differential amplifier coupled to a current mirror.

18. The demodulation phase locked loop according to claim 15, wherein said first voltage controlled current source comprises:
    a first transistor having an emitter, a base coupled to said high gain input of said controlled oscillator and a collector coupled to a signal line coupling said current controlled oscillator to said first and second current sources;
    a second transistor, having a base, a collector coupled to the emitter of said first transistor, and an emitter coupled to said second voltage source;
    a third transistor, having an emitter coupled to said second voltage source, a base coupled to said base of said second transistor, and a collector coupled to said base of said third transistor; and
    a fourth transistor, having a collector coupled to said first voltage source, a base coupled to a voltage reference, and an emitter coupled to said emitter of said first transistor.

19. The demodulation phase locked loop according to claim 15, wherein said second voltage controlled current source comprises:
    an amplifier, coupled to said low gain control input of said controlled oscillator and to a reference voltage, to provide an amplified output;
    a first pair of transistors, each having an emitter coupled to said first voltage source, a base coupled to said amplified output, and a collector;
    a second transistor, having a collector coupled to said first voltage source, an emitter coupled to said second voltage source, and a base coupled to said collector of said second transistor; and
    a second pair of transistors, each having a base coupled to said base of said second transistor, an emitter coupled to said second voltage source, and a collector, with each collector of said second pair of transistors being coupled to an associated collector of said first pair of transistors.

20. The demodulation phase locked loop according to claim 19, wherein said collectors of first transistors of said first and second transistor pair are coupled to a signal line coupled to said current controlled oscillator.

21. A demodulation phase-locked loop, comprising:

a mixer having a first input for receiving an input signal;

a controlled oscillator connected to the mixer, said controlled oscillator having a low gain control input, a high gain control input and an output connected to a second input of said mixer;

a controlled switch, having a first position for coupling said low gain control input of said controlled oscillator to a first signal line, and for coupling said high gain control input of said controlled oscillator to a second signal line, and having a second position for coupling said high gain control input to said first signal line, and said low gain control input to said second line, wherein said position of said switch is selected according to an operating mode of said phase-locked loop; and a control unit, coupled to said controlled switch, to select said position of said controlled switch such that said controlled oscillator provides a high gain output when said switch is in said first position, and said controlled oscillator provides a low gain output when said switch is in said second position.

22. The demodulation phase-locked loop according to claim 21, wherein said controlled oscillator further comprises:

a current controlled oscillator; and first and second voltage controlled current sources, coupled to said current controlled oscillator, each having a control input, with the control input of said first voltage controlled current source being coupled to said high gain control input and the control input of said second voltage controlled current source being coupled to said low gain control input.

23. The demodulation phase-locked loop according to claim 21, wherein said control unit causes said controlled oscillator to provide a high gain output when there is frequency mismatch between a first frequency of said input signal and a second frequency of a signal provided by said controlled oscillator, and wherein said control unit causes said controlled oscillator to provide a low gain output when the first frequency and the second frequency are similar.

24. A method for tuning a demodulating phase locked loop, said demodulating phase locked loop coupled to receive a carrier signal including an input signal and provide an output signal, the method comprising the steps of:

mixing a voltage controlled signal with the input signal to provide the output signal, wherein the voltage controlled signal is provided by a voltage controlled oscillator having a high gain input and a low gain input;

operating said phase locked loop in a tuning mode of operation during which said phase locked loop is tuned to a first frequency of said carrier signal by coupling said high gain input to a first signal line and said low gain input to a second signal line; and switching said phase locked loop to operate in a demodulation mode of operation by coupling said high gain input to said second signal line and said low gain input to said first signal line, including the step of demodulating said input signal from said carrier signal to provide said output signal responsive to said phase locked loop being tuned to said first frequency of said carrier signal.

25. The method according to claim 24, wherein said voltage controlled signal is a high gain signal when said phase locked loop operates in tuning mode, and wherein said voltage controlled signal is a low gain signal when said phase locked loop operates in demodulation mode.

26. The method according to claim 24, wherein said step of switching further comprises the steps of:

comparing said first frequency of said carrier signal to a second frequency of said voltage controlled signal, wherein said voltage controlled signal is derived from said output signal; and switching from said tuning mode of operation to said demodulation mode of operation responsive to said first frequency being substantially equal to said second frequency.

27. The method according to claim 26, wherein said step of switching further comprises the steps of:

filtering said output signal to retrieve said input signal;

comparing a first voltage level of said output signal to a second voltage level of said input signal; and wherein said step of switching from said tuning mode of operation to said demodulation mode of operation is further responsive to said first voltage level being substantially equal to said second voltage level.

28. The method according to claim 27, wherein said high gain input is coupled to said output signal and said low gain input is coupled to said input signal in said tuning mode of operation.

29. The method according to claim 28, wherein said step of switching couples said high gain input of said voltage controlled oscillator to said input signal and couples said low gain input of said voltage controlled oscillator to said output signal in said demodulation mode of operation.

30. The method according to claim 28, wherein said voltage controlled oscillator further comprises a current controlled oscillator and first and second voltage controlled current sources, coupled to said current controlled oscillator, each of said first and second voltage controlled current sources having a control input, with said control input of said first voltage controlled current source being coupled to said high gain input of said voltage controlled oscillator and said control input of said second voltage controlled current source being coupled to said low gain input of said voltage controlled oscillator, and wherein the step of providing a voltage controlled signal further comprises the step of:

outputting said voltage controlled signal responsive to a current on a signal line coupling said current controlled oscillator to said voltage controlled current sources.

31. The method according to claim 30, wherein each of said first and second voltage controlled current sources comprise a first and second end, each coupled at said first end to a first voltage source, and at said second end to a second voltage source, where a voltage provided by of said second voltage source is relatively smaller than a voltage provided by said first voltage source.

32. The method according to claim 30, wherein said current controlled oscillator is an emitter coupled oscillator.

33. The method according to claim 30, wherein said first voltage controlled current source comprises a differential amplifier coupled to a current mirror.

34. The method according to claim 30, wherein said second voltage controlled current source comprises an operational amplifier coupled to a current mirror.

* * * * *